United States Patent
Chae

(10) Patent No.: US 8,199,271 B2
(45) Date of Patent: Jun. 12, 2012

(54) LIQUID CRYSTAL DISPLAY DEVICE WITH ACTIVE LAYER OVER THE GATE LINE, DATA LINE, GATE ELECTRODE AND SOURCE/DRAIN ELECTRODES

(75) Inventor: Gee Sung Chae, Incheon-kwangyokshi (KR)

(73) Assignee: LG Display, Co., Ltd., Seoul (KR)

( * ) Notice: Subject to any disclaimer, the term of this patent is extended or adjusted under 35 U.S.C. 154(b) by 0 days.

(21) Appl. No.: 12/877,672

(22) Filed: Sep. 8, 2010

(65) Prior Publication Data

US 2010/0327272 A1     Dec. 30, 2010

Related U.S. Application Data

(62) Division of application No. 11/293,079, filed on Dec. 5, 2005, now Pat. No. 7,817,218.

(30) Foreign Application Priority Data

May 6, 2005  (KR) .................. 10-2005-0037874

(51) Int. Cl.
*G02F 1/136* (2006.01)
*G02F 1/1343* (2006.01)
(52) U.S. Cl. ........... 349/43; 349/140; 349/147; 349/148
(58) Field of Classification Search .................... 349/43, 349/140, 147–148
See application file for complete search history.

(56) References Cited

U.S. PATENT DOCUMENTS

| | | | |
|---|---|---|---|
| 5,477,355 A | 12/1995 | Sasaki et al. | |
| 6,222,602 B1 | 4/2001 | Aratani et al. | |
| 2003/0117535 A1* | 6/2003 | Park et al. | 349/39 |
| 2003/0222310 A1* | 12/2003 | Wu et al. | 257/347 |
| 2004/0183070 A1* | 9/2004 | Afzali-Ardakani et al. | 257/40 |
| 2004/0239826 A1 | 12/2004 | Park et al. | |
| 2005/0140840 A1* | 6/2005 | Hirakata et al. | 349/43 |
| 2006/0103773 A1 | 5/2006 | Suh et al. | |

FOREIGN PATENT DOCUMENTS

JP   10-125924         5/1998
KR   10-2000-0062886 A  10/2000

* cited by examiner

*Primary Examiner* — Jessica M Merlin
(74) *Attorney, Agent, or Firm* — McKenna Long & Aldridge LLP

(57) ABSTRACT

An LCD device and a method for fabricating the same is disclosed that improves a yield by decreasing processing time. The LCD device includes gate and data lines formed substantially perpendicular to each other on a substrate and defining a unit pixel region; a thin film transistor formed at a crossing of the gate and data lines; an active layer formed over the gate line, the data line, and the thin film transistor; an organic resin formed on a portion of a gate insulating layer not including the gate line, the data line, and the thin film transistor; a passivation layer formed on an entire surface of the substrate including the thin film transistor; and a pixel electrode, formed in the unit pixel region, the pixel electrode being connected with a drain electrode of the thin film transistor.

10 Claims, 13 Drawing Sheets

LIQUID CRYSTAL DISPLAY DEVICE WITH ACTIVE LAYER OVER THE GATE LINE, DATA LINE, GATE ELECTRODE AND SOURCE/DRAIN ELECTRODES

This application is a divisional of application Ser. No. 11/293,079, filed Dec. 5, 2005 now U.S. Pat. No. 7,817,218 and claims the benefit of the Korean Patent Application No. P2005-0037874, filed on May 6, 2005, which is hereby incorporated by reference as if fully set forth herein.

BACKGROUND OF THE INVENTION

1. Field of the Invention

The present invention relates to a liquid crystal display LCD device, and more particularly, to an LCD device and a method for fabricating the same to improve a yield with a decreased process time.

2. Discussion of the Related Art

Recent efforts have been made to research and develop various types of flat display devices, such as liquid crystal display (LCD), plasma display panel (PDP), electroluminescent display (ELD), and vacuum fluorescent display (VFD). Some types of flat display devices have already been used as displays in various applications.

Among the types of flat display devices, liquid crystal display (LCD) devices have been most widely used due to its advantageous characteristics of thin profile, lightness in weight, and low power consumption, whereby the LCD devices provides a substitute for a Cathode Ray Tube (CRT). In addition to mobile type LCD devices such as a display for a notebook computer, LCD devices have been developed for computer monitors and televisions to receive and display broadcasting signals.

Despite various technical developments in the LCD technology having applications in different fields, research in enhancing the picture quality of the LCD device has been, in some respects, lacking as compared to other features and advantages of the LCD device. In order to use LCD devices in various fields as a general display, the key to developing LCD devices depends on whether LCD devices can realize a high quality picture, such as high resolution and high luminance with a large-sized screen, while still maintaining lightness in weight, thin profile, and low power consumption.

Generally, the LCD device includes an LCD panel for displaying a picture image, and a driving part for applying a driving signal to the LCD panel. The LCD panel includes first and second glass substrates being bonded to each other at a predetermined interval therebetween, and a liquid crystal layer formed between the first and second glass substrates by injection of liquid crystal.

The first glass substrate (TFT array substrate) includes a plurality of gate and data lines, a plurality of pixel electrodes, and a plurality of thin film transistors. The plurality of gate lines are formed at fixed intervals in a first direction on the first glass substrate, and the plurality of data lines are formed at fixed intervals in a second direction perpendicular to the first direction. Then, the plurality of pixel electrodes, which are arranged in a matrix-type configuration, are respectively formed in pixel regions defined by the plurality of gate and data lines crossing each other. The plurality of thin film transistors are switched according to signals of the gate lines for transmitting signals of the data lines to the respective pixel electrodes.

The second glass substrate (color filter substrate) includes a black matrix layer that excludes light from regions except the pixel regions of the first substrate, R(red)/G(green)/B (blue) color filter layer displaying various colors, and a common electrode to obtain the picture image. In a case of an In-Plane Switching (IPS) mode LCD device, the common electrode is formed on the first glass substrate.

Next, a predetermined space is maintained between the first and second glass substrates by spacers, and the first and second substrates are bonded to each other by a seal pattern having a liquid crystal injection inlet. At this time, the liquid crystal layer is formed according to a liquid crystal injection method, in which the liquid crystal injection inlet is dipped into a vessel having liquid crystal while maintaining a vacuum state in the predetermined space between the first and second glass substrates. That is, the liquid crystal is injected between the first and second substrates by an osmotic action. Then, the liquid crystal injection inlet is sealed with a sealant.

Meanwhile, the LCD device is driven according to the optical anisotropy and polarizability of liquid crystal material. Liquid crystal molecules are aligned using directional characteristics because the liquid crystal molecules each has long and thin shapes. In this respect, an induced electric field is applied to the liquid crystal for controlling the alignment direction of the liquid crystal molecules. That is, if the alignment direction of the liquid crystal molecules is controlled by the induced electric field, the light is polarized and changed by the optical anisotropy of the liquid crystal, thereby displaying the picture image. In this state, the liquid crystal is classified into positive (+) type liquid crystal having positive dielectric anisotropy and negative (−) type liquid crystal having negative dielectric anisotropy according to electrical characteristics of the liquid crystal. In the positive (+) type liquid crystal, a longitudinal (major) axis of a positive (+) liquid crystal molecule is arranged in parallel to the electric field applied to the liquid crystal. Meanwhile, in the negative (−) type liquid crystal, a longitudinal (major) axis of a negative (−) liquid crystal molecule is arranged in perpendicular to the electric field applied to the liquid crystal.

Hereinafter, a related art LCD device will be described with reference to the accompanying drawings.

FIG. 1 illustrates an expanded plan view of a unit pixel of an LCD device according to the related art. FIG. 2 illustrates a cross sectional view along 1-1' of FIG. 1. FIGS. 3A to 3E illustrate cross sectional views of a process for fabricating an LCD device according to the related art.

As shown in FIGS. 1 and 2, the LCD device according to the related art includes a lower substrate 20 and an upper substrate. The lower substrate 20 includes a gate line 21, a data line 24, a pixel electrode 27, and a thin film transistor TFT. The gate line 21 is formed perpendicular to the data line 24, to define a unit pixel region P. Also, the pixel electrode 27 is formed in the unit pixel region P, and the thin film transistor TFT is formed at a crossing of the gate and data lines 21 and 24.

The thin film transistor TFT is comprised of a gate electrode 21a, a gate insulating layer 22, an active layer 23, a source electrode 24a, and a drain electrode 24b. The gate electrode 21a protrudes from the gate line 21, and the gate insulating layer 22 is formed on an entire surface of the lower substrate 20. Then, the active layer 23 is formed on the gate insulating layer 22 over the gate electrode 21a. The source electrode 24a, which protrudes from the data line 24, overlaps one side of the active layer 23. The drain electrode 24b, which is formed at a predetermined interval from the source electrode 24a, overlaps the other side of the active layer 23. In addition, an ohmic contact layer 23a is formed between the active layer 23 and the source electrode 24a, and between the active layer 23 and the drain electrode 24b.

Furthermore, a first storage electrode 24c is formed on the gate insulating layer 22 above a preceding gate line.

A passivation layer 25 is formed on the entire surface of the lower substrate 20 including the thin film transistor TFT. Also, a first contact hole 26a is formed in a predetermined portion of the drain electrode 24b, and a second contact hole 26b is formed in a predetermined portion of the first storage electrode 24c.

A pixel electrode 27 is formed in the pixel region on the passivation layer 25 such that the pixel electrode 27 is connected with the drain electrode 24b through the first contact hole 26a. Also, a second storage electrode 28 is formed by extending the pixel electrode to the preceding gate line including the second contact hole 26b.

The pixel electrode 27 and the second storage electrode 28 are formed of a transparent conductive metal having a great transmittance of light, for example, indium-tin-oxide ITO.

Although not shown, the upper substrate is formed opposite to the lower substrate 20. The upper substrate includes a black matrix layer, an RGB color filter layer, and a common electrode. The black matrix layer is provided to prevent light from leaking in other portions except the pixel region P. The RGB color filter layer is formed to represent colors, and the common electrode is formed to realize images.

A method for fabricating the LCD device according to the related art will be described as follows.

First, as shown in FIG. 3A, a conductive metal is coated on the transparent lower substrate 20, and is then patterned by photolithography using a first mask. As a result, the gate line 21 is formed in one direction on the lower substrate 20. In this state, the gate electrode 21a is formed at one side of the gate line 21.

After that, as shown in FIG. 3B, the gate insulating layer 22 is formed on the entire surface of the lower substrate 20 including the gate line 21. At this time, the gate insulating layer 22 may be formed of silicon nitride $SiN_x$ or silicon oxide $SiO_2$.

After that, a semiconductor layer (mixture of amorphous silicon and impurity amorphous silicon) is formed on the gate insulating layer 22.

Subsequently, the semiconductor layer is patterned by photolithography using a second mask. Thus, the active layer 23 of an island shape is formed above the gate electrode 21a.

After that, as shown in FIG. 3C, a conductive metal is deposited on the entire surface of the lower substrate 20 including the active layer 23, and is then patterned by photolithography using a third mask. As a result, the data line 24 is formed perpendicular to the gate line 21, the source electrode 24a which protrudes from one side of the data line 24 overlaps one side of the active layer 23, and the drain electrode 24b overlaps the other side of the active layer 23. At this time, the drain electrode 24b is formed at a predetermined interval from the source electrode 24a. Also, the first storage electrode 24c is formed above a predetermined portion of the preceding gate line 21.

When etching the data line 24, the source electrode 24a, and the drain electrode 24b, the impurity amorphous silicon is over-etched. Thus, the ohmic contact layer 23a is formed between the source electrode 24a and the active layer 23, and between the drain electrode 24b and the active layer 23.

In the above process, the gate line 21 is formed perpendicular to the data line 24, thereby defining the pixel region P.

As shown in FIG. 3D, the passivation layer 25 is deposited on the entire surface of the lower substrate 20 including the data line 24. Subsequently, the first and second contact holes 26a and 26b are formed to expose the drain electrode 24b and the first storage electrode 24c, respectively.

Referring to FIG. 3E, a transparent conductive layer is deposited on the passivation layer 25, and is selectively removed by photolithography using a fifth mask, thereby forming the pixel electrode 27 in the pixel region. The pixel electrode 27 of the transparent conductive layer extends to the preceding gate line including the second contact hole 26b, thereby forming the second storage electrode 28.

Through the above-mentioned process according to the related art, the five masks are totally required so that it has a limitation in improvement of yield.

SUMMARY OF THE INVENTION

Accordingly, the present invention is directed to an LCD device and a method for fabricating the same that substantially obviates one or more problems due to limitations and disadvantages of the related art.

An advantage of the present invention is to provide an LCD device and a method for fabricating the same to improve a yield by decreasing a process time.

Additional advantages and features of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the invention, as embodied and broadly described herein, an LCD device includes gate and data lines formed substantially perpendicular to each other on a substrate and defining a unit pixel region; a thin film transistor formed at a crossing of the gate and data lines; an active layer formed over the gate line, the data line, and the thin film transistor; an organic resin formed on a portion of a gate insulating layer not including the gate line, the data line, and the thin film transistor; a passivation layer formed on an entire surface of the substrate including the thin film transistor; and a pixel electrode, formed in the unit pixel region and connected with a drain electrode of the thin film transistor.

In another aspect of the present invention, a method for fabricating an LCD device includes forming a gate line including a gate electrode on a substrate; forming a gate insulating layer on the substrate including the gate line; forming a data line substantially perpendicular to the gate line and defining a unit pixel region, wherein source and drain electrodes respectively overlap both sides of the gate electrode; forming an insulating organic resin on a portion of the gate insulating layer not including the gate electrode, the gate line, the data line, the source electrode, and the drain electrode; forming an active layer on portions of the substrate except the organic resin; forming a passivation layer on an entire surface of the substrate including the data line; and forming a pixel electrode in the pixel region, wherein the pixel electrode being contacts the drain electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification; illustrate embodiments of the invention and together with the description serve to explain the principle of the invention. In the drawings.

DETAILED DESCRIPTION OF THE ILLUSTRATED EMBODIMENTS

Reference will now be made in detail to the preferred embodiments of the present invention, examples of which are illustrated in the accompanying drawings.

Hereinafter, an LCD device and a method for fabricating the same according to the present invention will be described with reference to the accompanying drawings.

First, an LCD device according to the present invention will be described.

Figure 1:
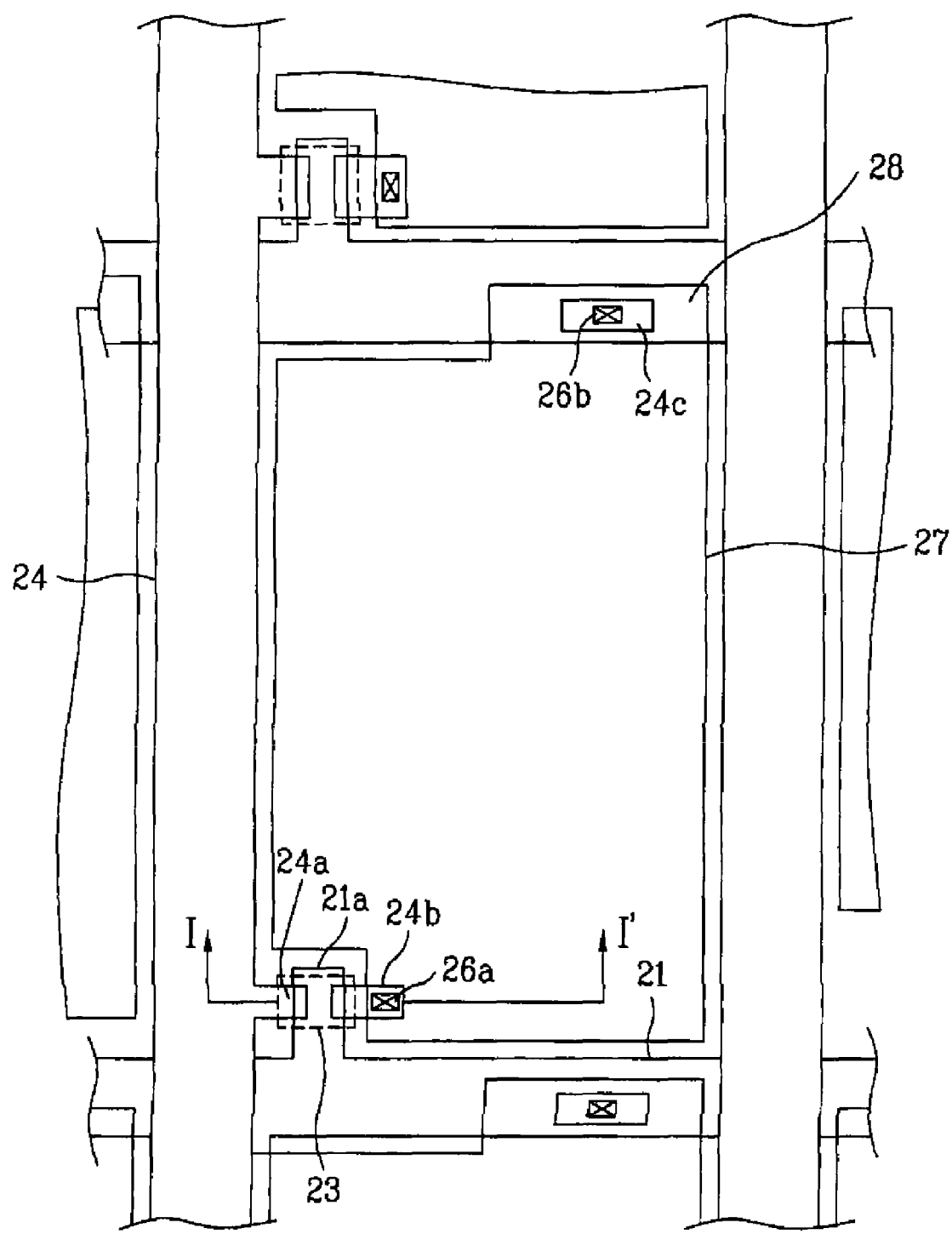
FIG. 1 illustrates an expanded plan view of a unit pixel of an LCD device according to the related art.
Figure 2:
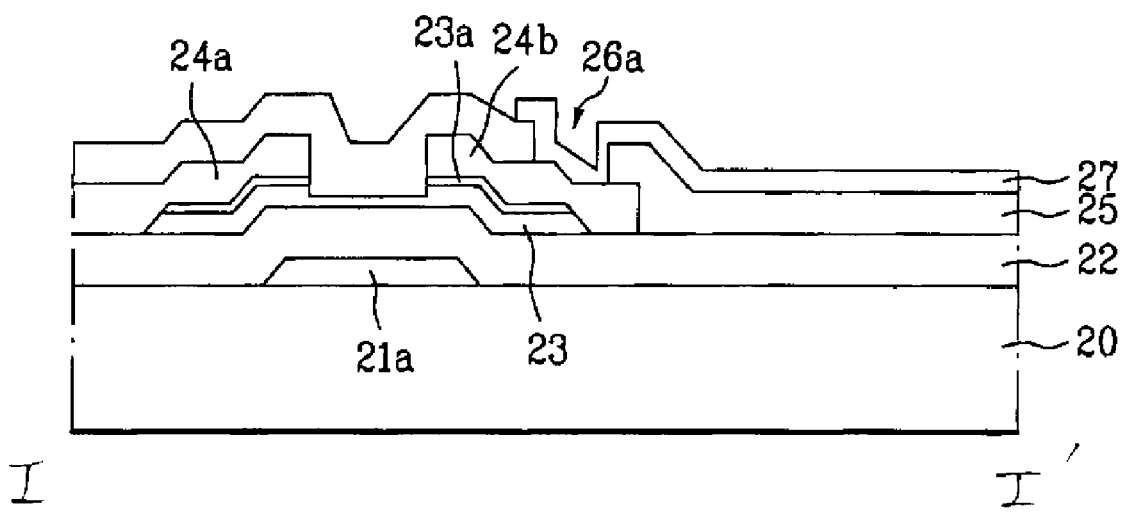
FIG. 2 illustrates a cross sectional view along I-I' of FIG. 1.
Figure 3A:
FIGS. 3A to 3E illustrate cross sectional views of a process for fabricating an LCD device according to the related art.
Figure 3B:
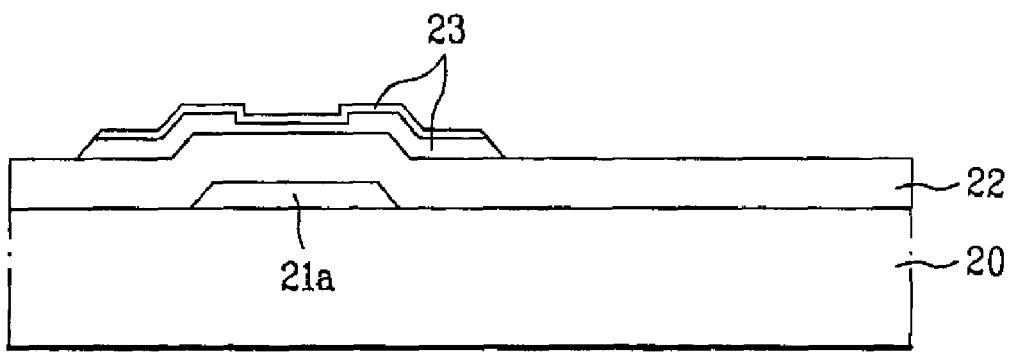
Figure 3C:
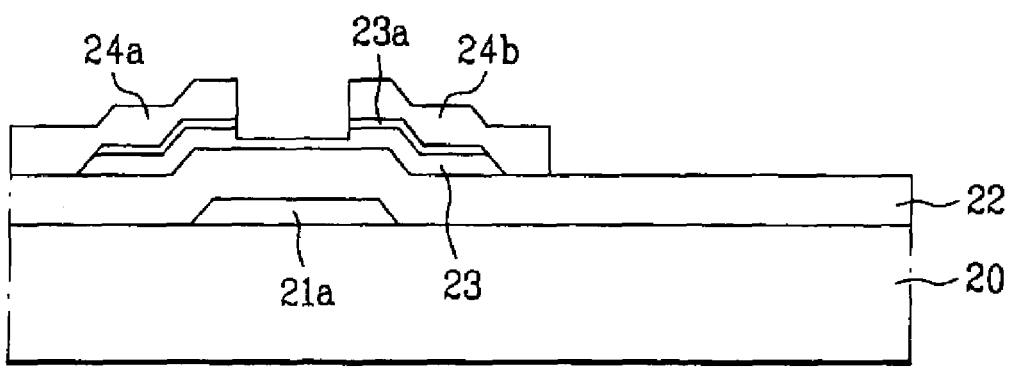
Figure 3D:
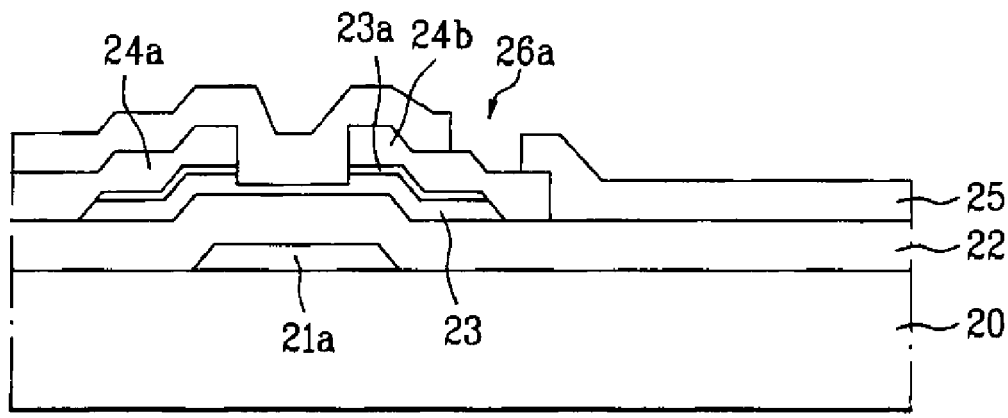
Figure 3E:
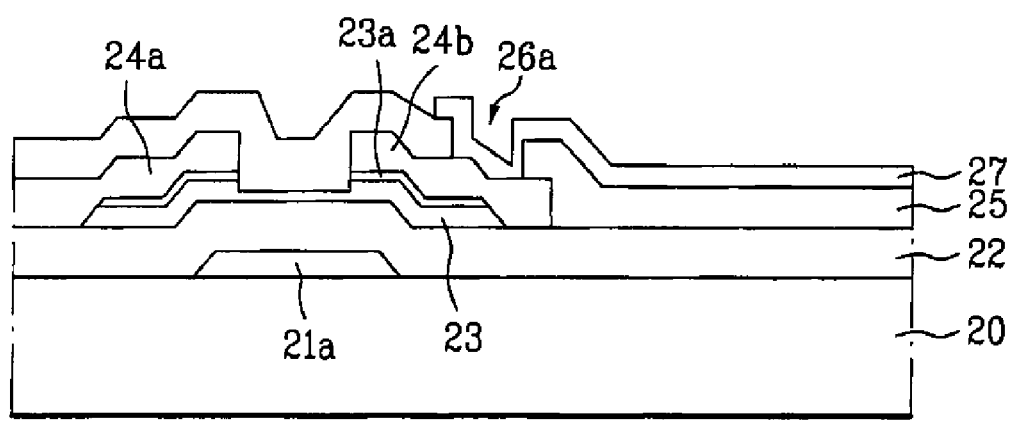
Figure 4:
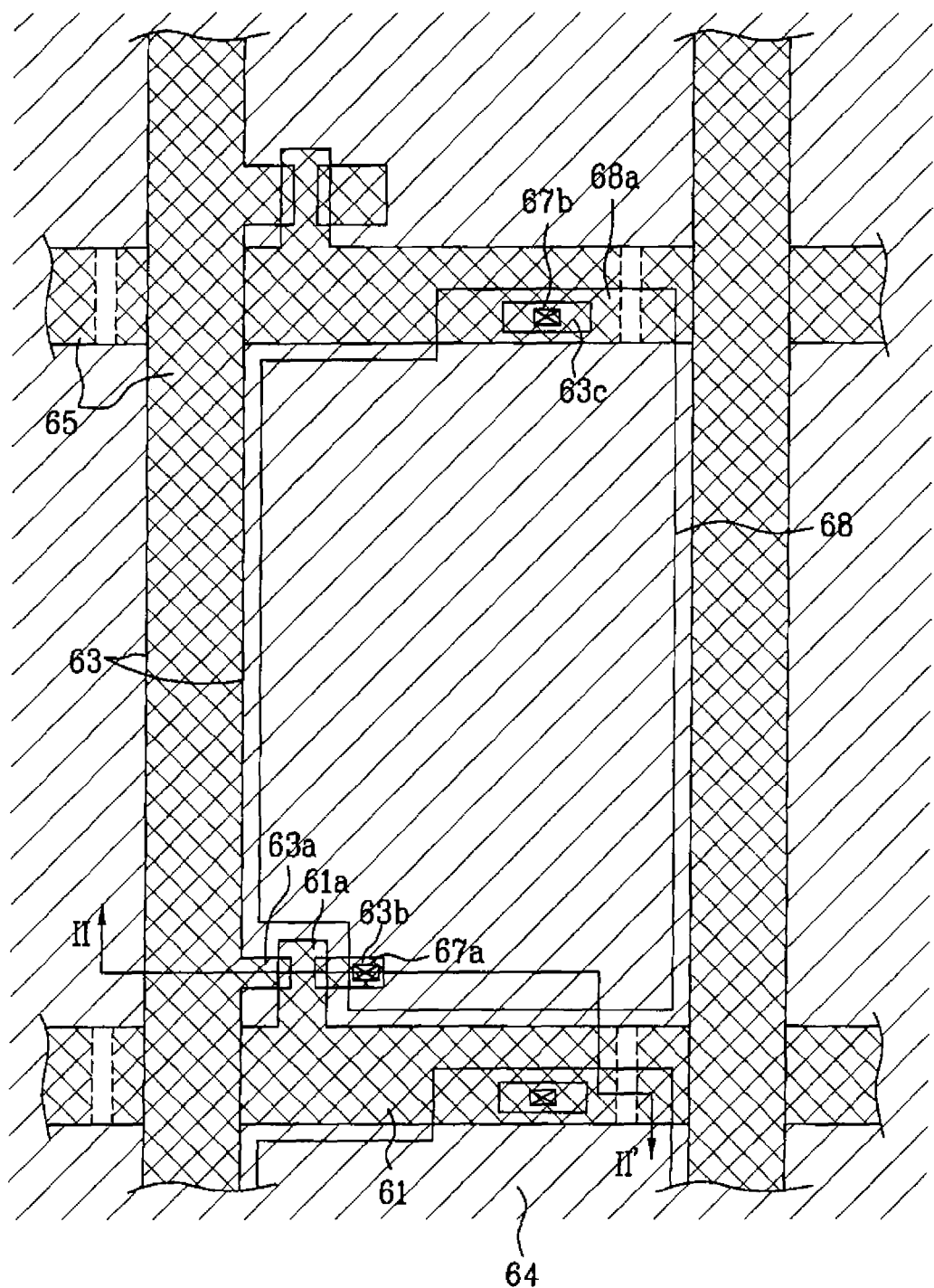
FIG. 4 illustrates an expanded plan view of a unit pixel of an LCD device according to an embodiment of the present invention.
Figure 5:
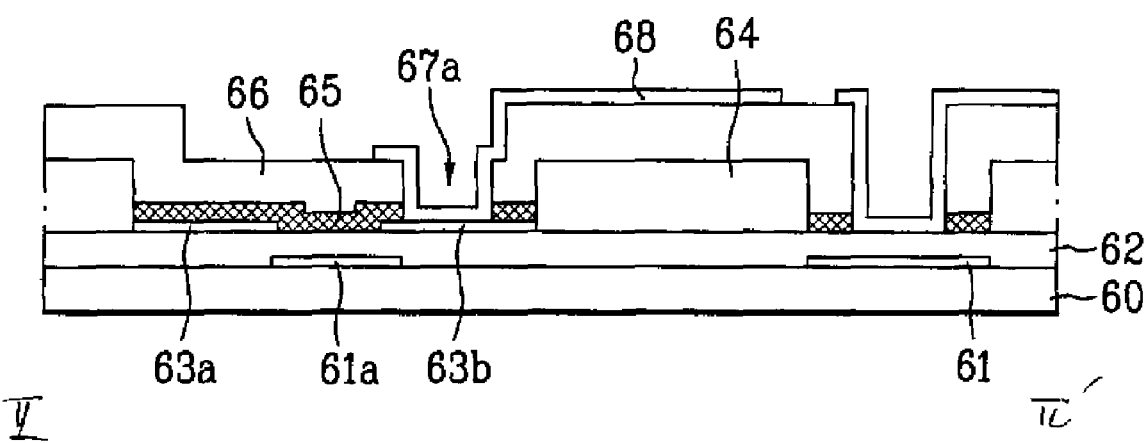
FIG. 5 illustrates a cross sectional view along II-II' of FIG. 4.

FIG. 4 illustrates an expanded plan view of a unit pixel of an LCD device according to an embodiment of the present invention. FIG. 5 illustrates a cross sectional view along II-II' of FIG. 4.

As shown in FIG. 4 and FIG. 5, a gate line 61 and a data line 63 are formed on a lower substrate 60, wherein the gate line 61 is formed substantially perpendicular to the data line 63 to define a unit pixel region P. Then, a pixel electrode 68 is formed in the unit pixel region P, and a thin film transistor TFT is formed at a crossing of the gate and data line 61 and 63.

The thin film transistor TFT is comprised of a gate electrode 61a, a gate insulating layer 62, a source electrode 63a, a drain electrode 63b, and an active layer 65. The gate electrode 61a protrudes from the gate line 61, and the gate insulating layer 62 is formed on an entire surface of the lower substrate 60. Also, the source electrode 63a which protrudes from the data line 63 overlapped with one side of the gate electrode 61a. The drain electrode 63b is overlapped with the other side of the gate electrode 61a. The source electrode 63a is formed at a predetermined interval from the drain electrode 63b. Then, the active layer 65 is formed over the gate electrode 61a, the source electrode 63a, and the drain electrode 63b.

The active layer 65 is formed in correspondence with the gate line 61, the gate electrode 61a, the data line 63, the source electrode 63a, and the drain electrode 63b.

The active layer 65 is formed of an organic semiconductor material such as pentacene and a nano-semiconductor material floating in a predetermined liquid.

Also, an insulating organic resin 64 is coated on the gate insulating layer 62 except the active layer 65. The insulating organic resin 64 is hardened by UV irradiation. For example, the insulating organic resin 64 is formed by hardening acryl base or epoxy base.

Then, a first storage electrode is formed on the gate insulating layer 62 above preceding gate line.

After that, a passivation layer 66 is formed on the entire surface of the lower substrate 60 including the thin film transistor TFT. Also, the passivation layer 66 and the active layer 65 are etched in the predetermined portions of the drain electrode 63b and the first storage electrode 63c, thereby forming first and second contact holes 67a and 67b.

Also, the active layer 65 and the passivation layer 66 which are formed above the gate line 61 adjacent to the data line 63 are also etched and patterned. By removing the active layer 65 formed above the gate line 61 adjacent to the data line 63, it is possible to remove noise caused between each data line 63.

The pixel electrode 68 is formed on the passivation layer 66 in correspondence with the pixel region. Also, the pixel electrode 68 is connected with the drain electrode 63b through the first contact hole 67a.

Also, a second storage electrode 68b is formed by extending the pixel electrode 68 to the preceding gate line, for being connected with the first storage electrode 63c through the second contact hole 67b.

At this time, the pixel electrode 68 and the second storage electrode 68a are formed of transparent conductive metal having a great light transmittance, for example, indium-tin-oxide ITO, tin-oxide TO, indium-zinc-oxide IZO, or indium-tin-zinc-oxide ITZO.

Although not shown, an upper substrate is formed opposite to the lower substrate. The upper substrate includes a black matrix layer for preventing light leakage in other portions except the pixel region P, an RGB color filter layer for representing colors, and a common electrode for realizing images.

A method for fabricating the LCD device according to the present invention will be described as follows.

FIGS. 6A to 6E illustrate cross sectional views of a process for fabricating the LCD device according to an embodiment of the present invention. FIGS. 7A to 7E illustrate plan views for a process of fabricating the LCD device according to the embodiments of the present invention.

Figure 6A:
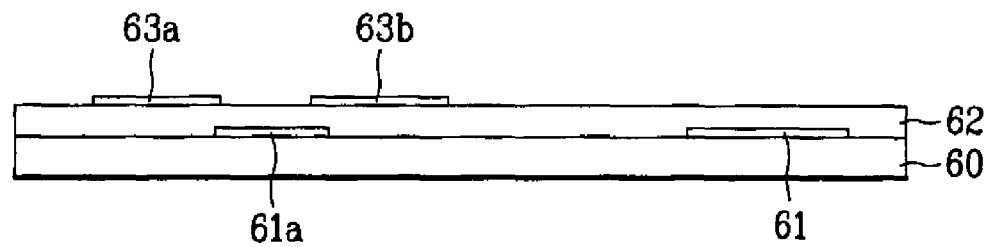
FIGS. 6A to 6E illustrate cross sectional views of a process for fabricating an LCD device according to an embodiment of the present invention.
Figure 7A:
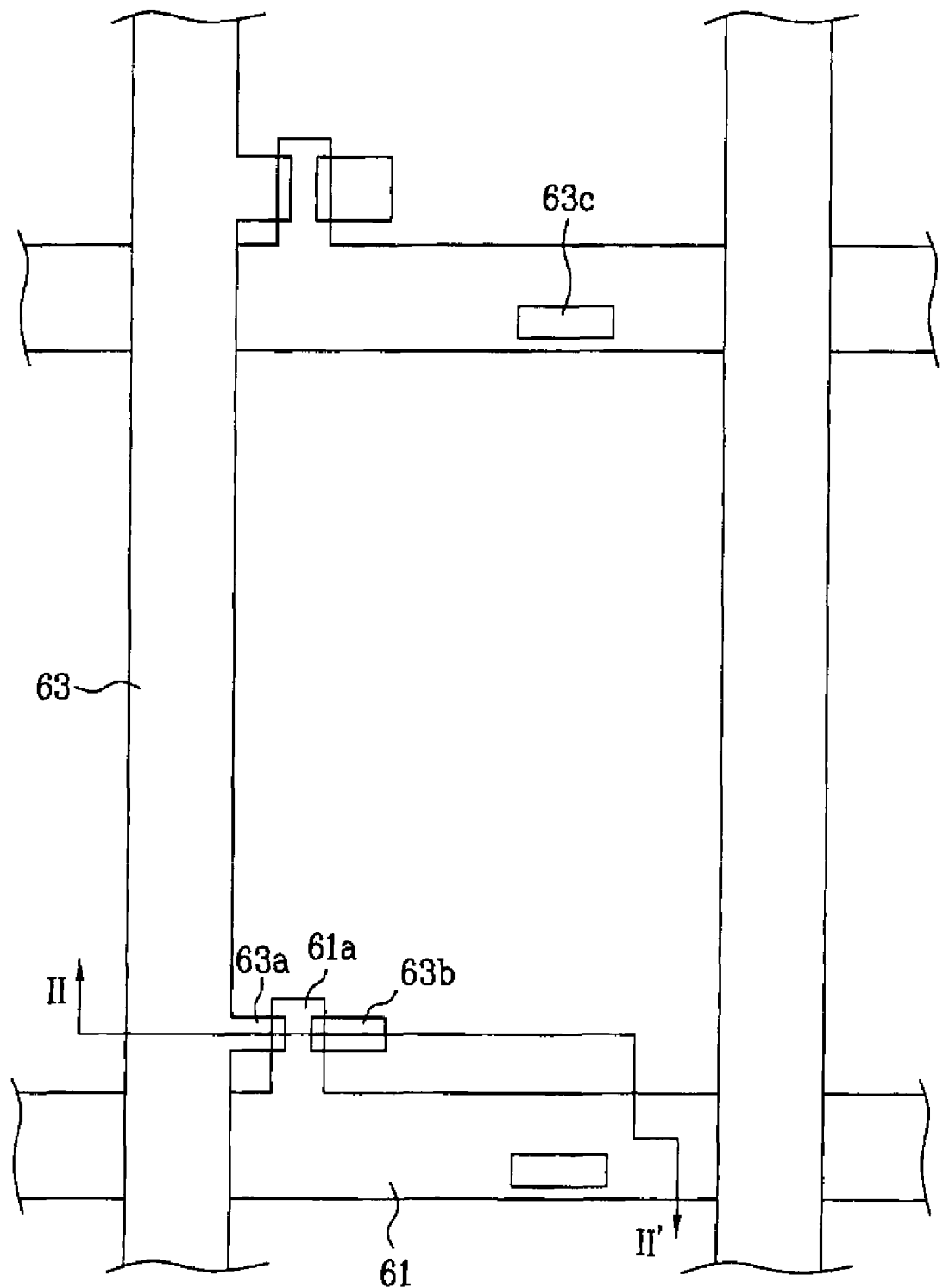
FIGS. 7A to 7E illustrate plan views for a process of fabricating an LCD device according to an embodiment of the present invention.

First, as shown in FIG. 6A and FIG. 7A, a conductive metal is deposited on the transparent lower substrate 60, and is then patterned by photolithography using a first mask, thereby forming the gate line 61 in one direction. The gate electrode 61a protrudes from one side of the gate line 61.

After that, the gate insulating layer 62 is formed on the entire surface of the lower substrate 60 including the gate line 61. The gate insulating layer 62 may be formed of silicon nitride $SiN_x$ or silicon oxide $SiO_2$.

Then, a conductive metal is deposited on the gate insulating layer 62, and is then patterned by photolithograph using a second mask, thereby forming the data line 63, the source electrode 63a, and the drain electrode 63b. The data line 63 is formed substantially perpendicular to the gate line 61. Also, the source electrode 63a which protrudes from one side of the data line 63 overlaps one side of the gate electrode 61a. The drain electrode 63b overlaps the other side of the gate electrode 61a, wherein the drain electrode 63b is formed at a predetermined interval from the source electrode 63a. At this time, the first storage electrode 63c is formed on the predetermined portion of a preceding gate line 61.

In the above-mentioned process, the gate line 61 is formed substantially perpendicular to the data line 63, thereby defining the unit pixel region P.

Figure 6B:
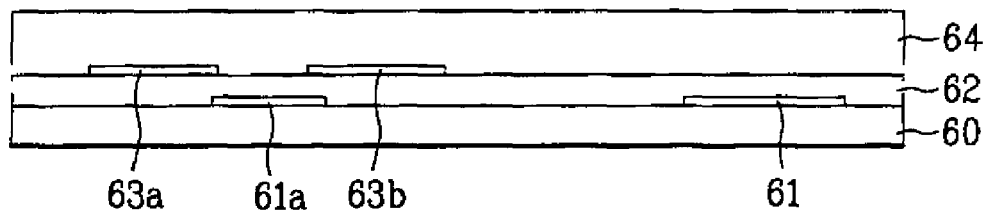
Figure 7B:
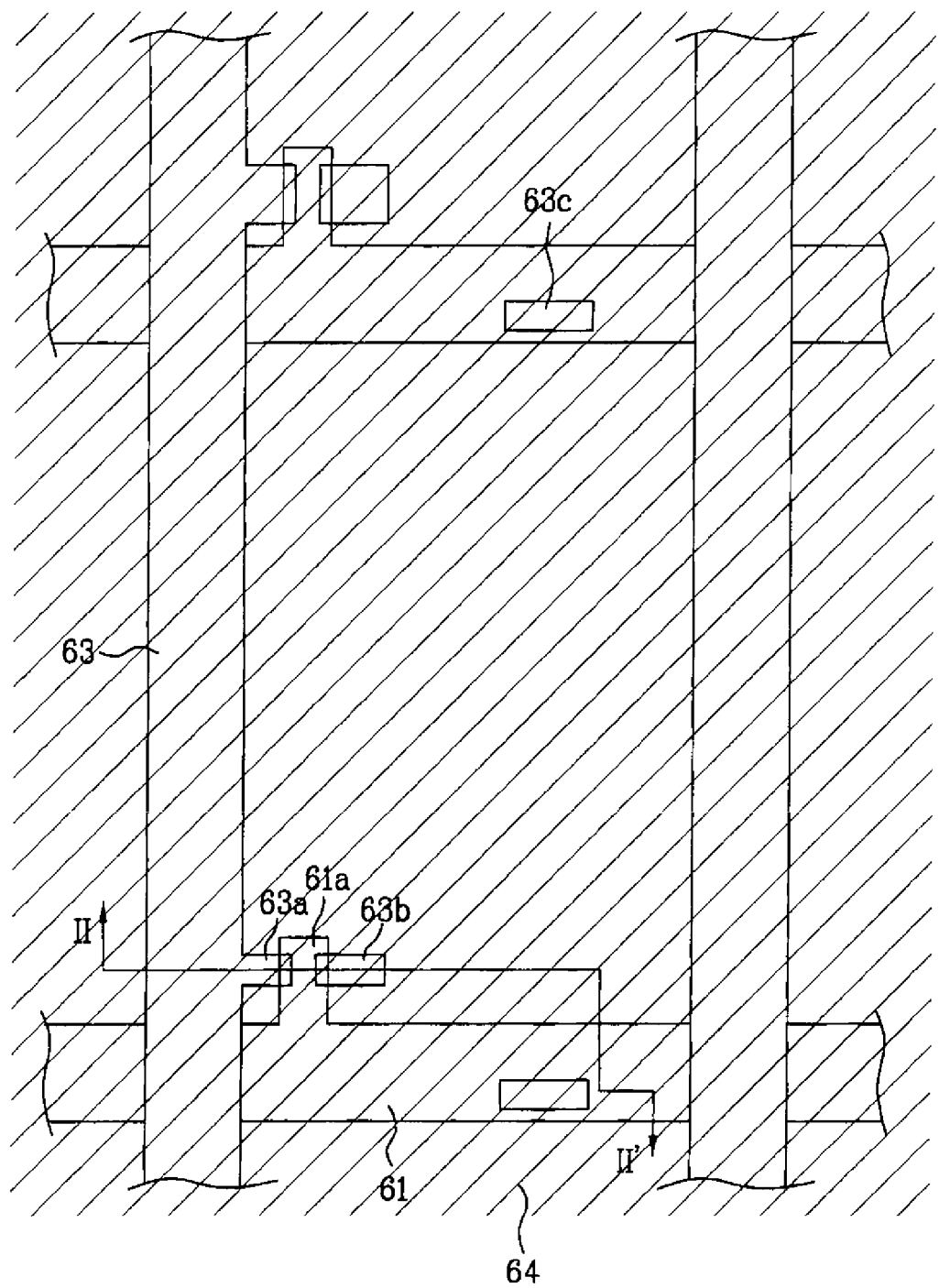

Referring to FIG. 6B and FIG. 7B, an insulating organic resin 64, which is a solution hardened by UV irradiation, is coated on the entire surface of the lower substrate 60 including the data line 63. For example, acryl base or epoxy base may be coated on the entire surface of the lower substrate 60 including the data line 63. The insulating organic resin 64 is transparent, and is a negative type in which the predetermined portion irradiated with UV rays remains.

Figure 6C:
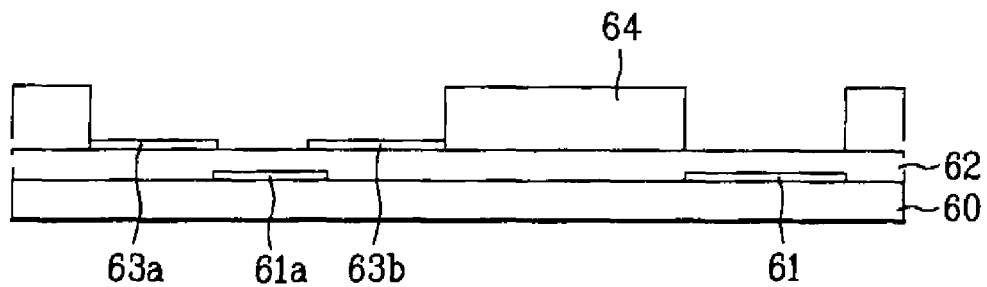
Figure 7C:
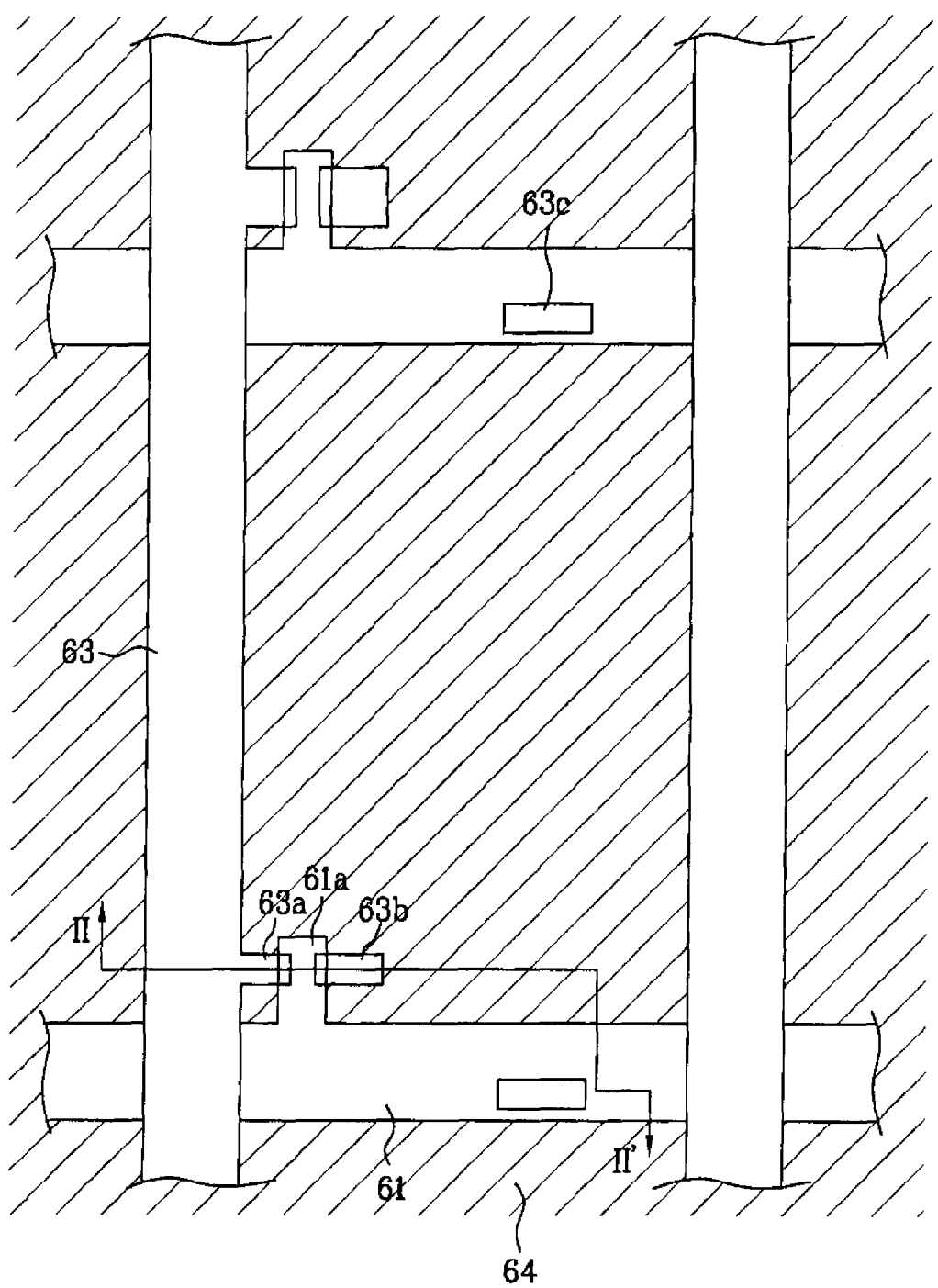

Next, as shown in FIG. 6C and FIG. 7C, the coated organic resin 64 is irradiated with UV rays from a rear surface of the lower substrate 60.

As applying UV rays to the rear surface of the lower substrate, the organic resin 64 positioned over the gate line 61, the gate electrode 61a, the data line 63, the source electrode 63a, and the drain electrode 63b is not hardened since it is not irradiated with UV rays, and the organic resin of the remaining portions is hardened.

After that, the organic resin 64 which is not hardened by UV rays is removed.

Figure 6D:
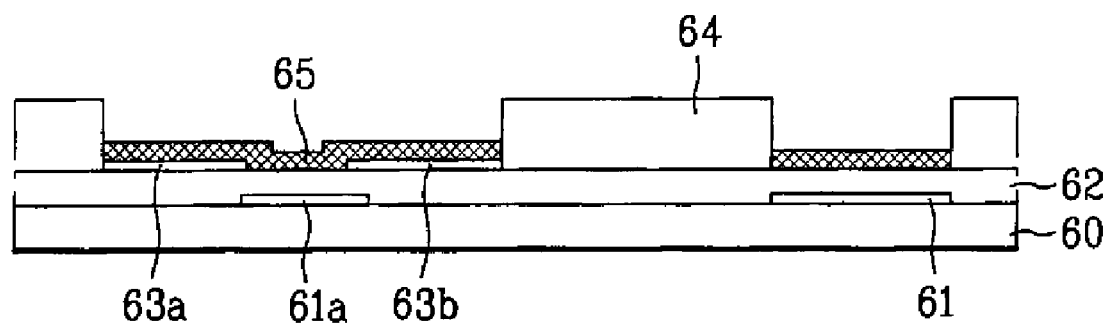
Figure 7D:
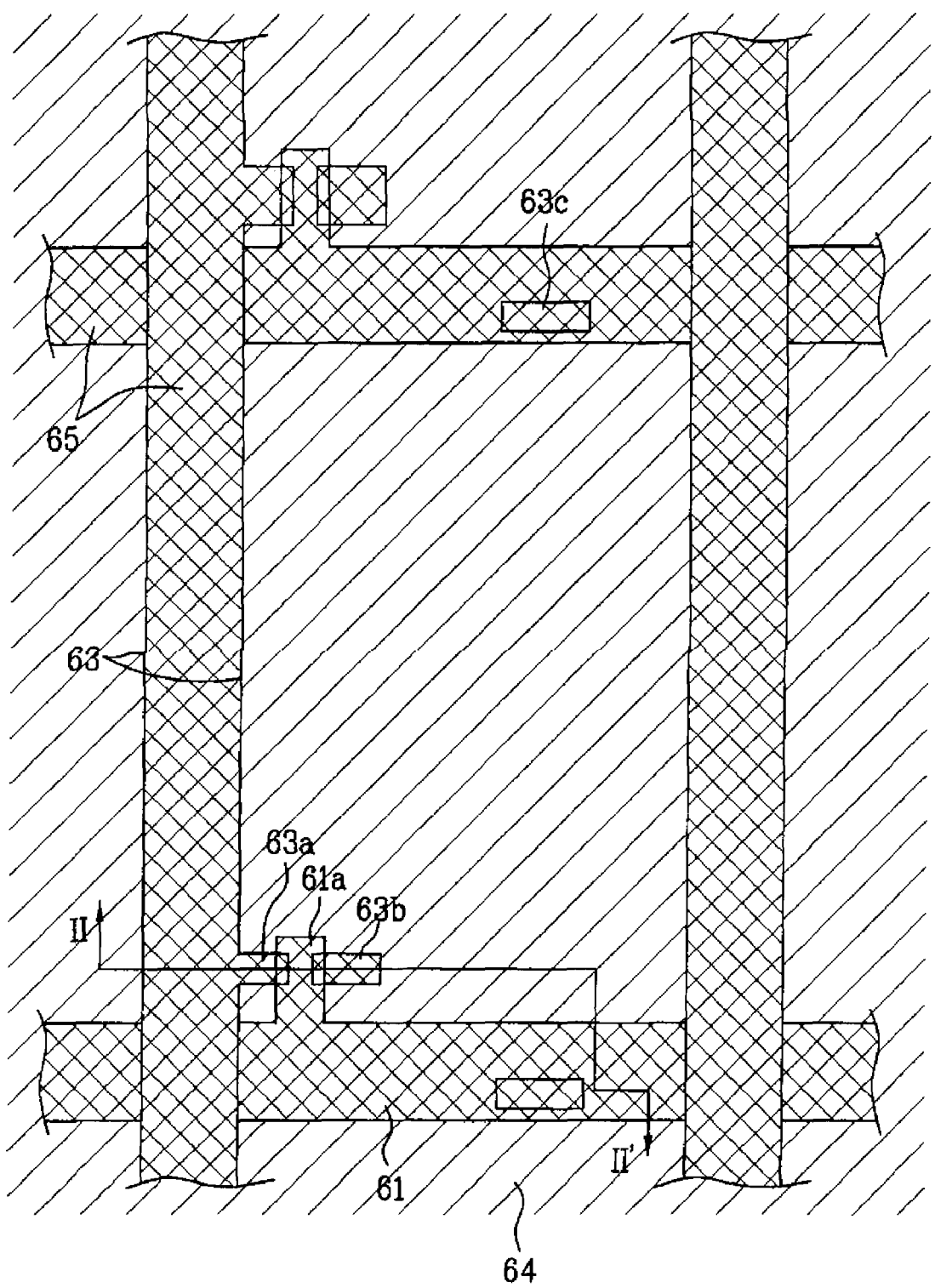

Subsequently, as shown in FIG. 6D and FIG. 7D, a liquid material, which is formed of a solvent having a semiconductor material dispersedly floating, is coated on the entire surface of the lower substrate 60. At this time, the liquid material includes an organic semiconductor such as pentacene.

The liquid material is coated only on a surface having a hydrophilic property except the organic resin 64 having a hydrophobic property. Then, a heat treatment is performed to the coated liquid material. Thus, the solvent is vaporized, and only the semiconductor material remains. As a result, the active layer 65 is formed over the gate line 61, the gate electrode 61a, the data line 63, the source electrode 63a, and the drain electrode 63b.

Figure 6E:
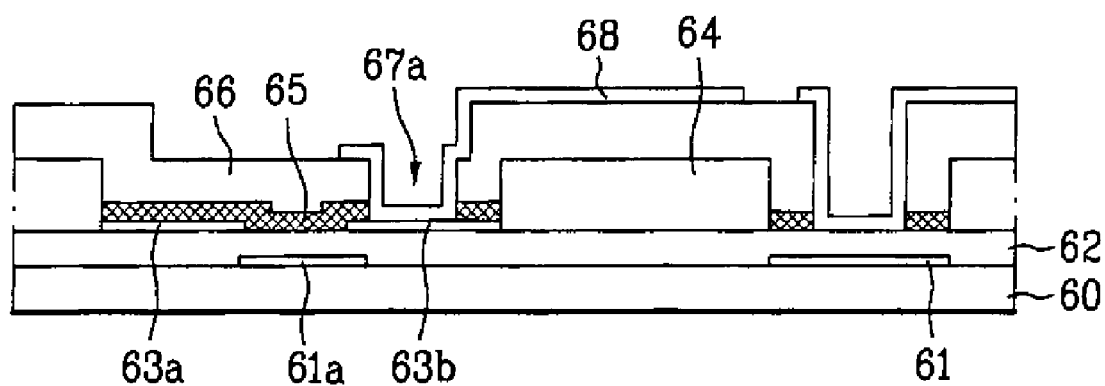
Figure 7E:
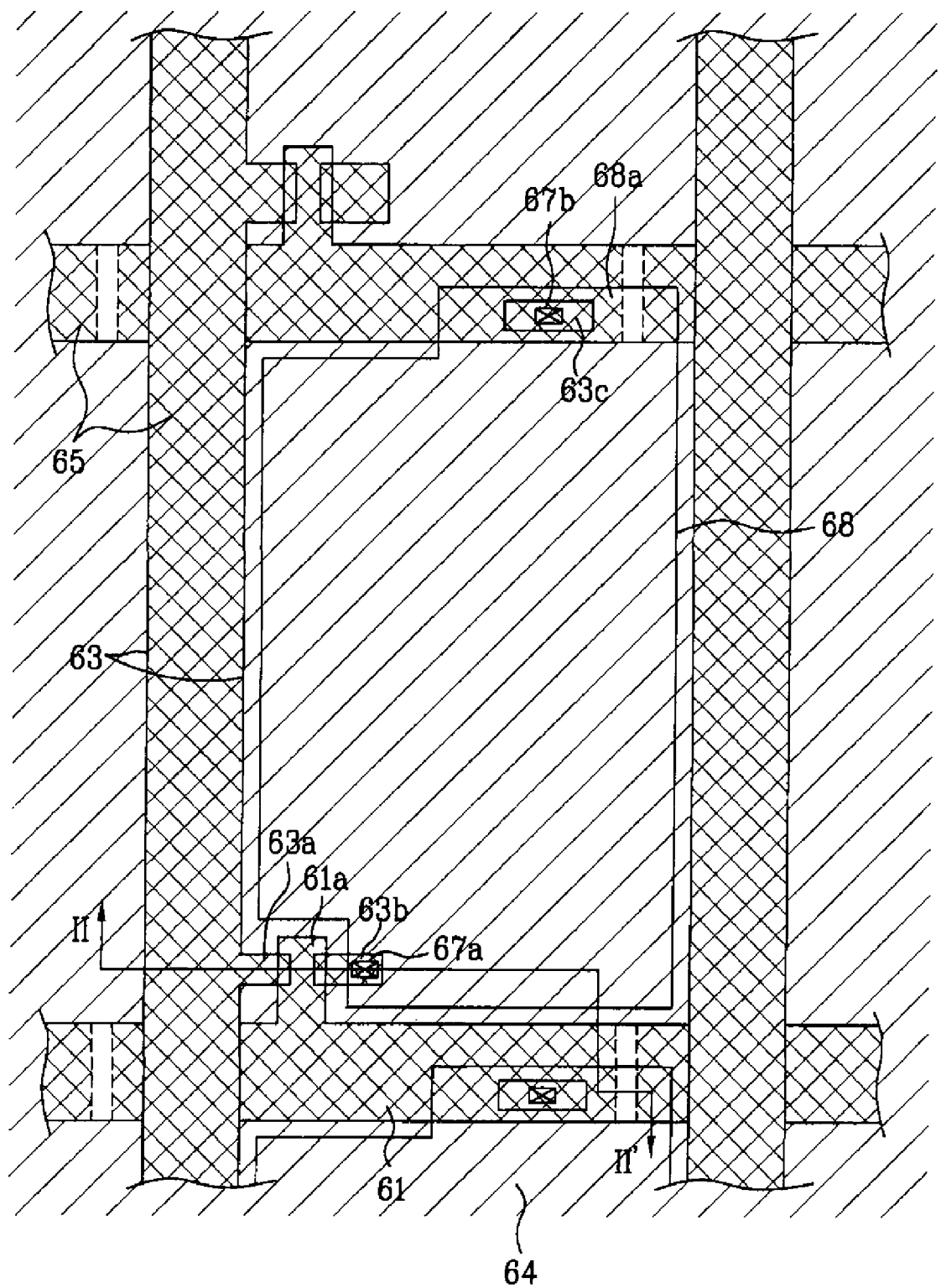

After that, as shown in FIG. 6E and FIG. 7E, the passivation layer 66 is deposited on the entire surface of the lower substrate 60 including the active layer 65. At this time, the passivation layer 66 may be formed of at least any one of oxide, nitride, photo acryl, polyimide, and BenzoCycloButene BCB.

Subsequently, the passivation layer 66 is patterned by photolithograph using a third mask, thereby forming the first and second contact holes 67a and 67b for respectively exposing the predetermined portions of the drain electrode 63c and the first storage electrode 63c.

When forming the first and second contact holes 67a and 67b, the active layer 65 and the passivation layer 66 positioned above the gate line 61 adjacent to the data line 63 are also removed. As a result, it is possible to minimize noise caused by the active layer adjacent to the data line 63.

After that, a transparent conductive layer is deposited on the passivation layer 66, and is selectively removed by photolithograph using a fourth mask, thereby forming the pixel electrode 68 in the pixel region P.

The transparent conductive layer is connected with the first storage electrode 63c through the second contact hole 67a. Also, the transparent conductive layer extends to the preceding gate line including the first storage electrode 63c, thereby forming the second storage electrode 68a.

According to the above-mentioned method, it is possible to form a storage-on-gate structure of a storage capacitor.

The transparent conductive layer may be formed of indium-tin-oxide ITO, tin-oxide TO, indium-zinc-oxide IZO, or indium-tin-zinc-oxide ITZO.

Although not shown, an alignment layer is formed on the entire surface of the lower substrate 60 including the pixel electrode 68. The alignment layer may be formed of a photo-alignment material or polyimide.

If the alignment layer is formed of polyimide, an alignment direction thereof is determined by a mechanical rubbing method. If the alignment material is formed of a photo-alignment material such as a polyvinylcinnamate-based material) or a polysiloxane-based material, an alignment direction thereof is determined by UV irradiation. At this time, the alignment direction is determined depending on the direction and property of light irradiated, that is, a polarizing direction.

As mentioned above, the LCD device and the method for fabricating the same according to the present invention have the following advantages.

In the method for fabricating the LCD device according to the present invention, the active layer can be formed by exposure of the rear surface and the liquid material without a mask. Accordingly, it is possible to obtain a simplified process with a decreased number of masks, thereby improving the yield.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An LCD device comprising:
   gate and data lines formed substantially perpendicular to each other on a substrate and defining a unit pixel region;
   a thin film transistor formed at a crossing of the gate and data lines and having a gate electrode and source/drain electrodes;
   an organic resin formed on a portion of a gate insulating layer except a portion on the gate line, the data line, the gate electrode, and the source/drain electrodes of the thin film transistor:
   an active layer over entire surfaces of the gate line, the data line, the gate electrode, and the source/drain electrodes of the thin film transistor;
   a passivation layer formed on an entire surface of the substrate including the thin film transistor except the portion on the drain electrode; and
   a pixel electrode formed in the unit pixel region, wherein the pixel electrode is connected with the drain electrode of the thin film transistor.

2. The LCD device of claim 1, wherein the active layer is selectively removed above the gate line adjacent to the data line.

3. The LCD device of claim 1, wherein the thin film transistor includes:
   the gate electrode protruding from the gate line;
   the gate insulating layer formed on the entire surface of the substrate;
   the source electrode protruding from the data line overlapping one side of the gate electrode;
   the drain electrode overlapping another side of the gate electrode, and formed at a predetermined interval from the source electrode; and
   the active layer formed over the gate electrode, the source electrode, and the drain electrode.

4. The LCD device of claim 1, wherein the active layer is formed of an organic semiconductor material and a nano-semiconductor material floating in a predetermined liquid.

5. The LCD device of claim 4, wherein the organic semiconductor material includes pentacene.

6. The LCD device of claim 1, further comprising:
   a first storage electrode formed on the gate insulating layer above a preceding gate line; and
   first and second contact holes formed in predetermined portions of the drain electrode and the first storage electrode.

7. The LCD device of claim 6, further comprising:

a second storage electrode formed by extending the pixel electrode to the preceding gate line, wherein the second storage electrode is connected with the first storage electrode through the second contact hole.

8. The LCD device of claim 7, wherein the pixel electrode and the second storage electrode are formed of transparent conductive metal having a high light transmittance.

9. The LCD device of claim 8, wherein the transparent conductive metal includes one of indium-tin-oxide (ITO), tin-oxide (TO), indium-zinc-oxide (IZO), or indium-tin-zinc-oxide (ITZO).

10. The LCD device of claim 1, wherein the organic resin has an insulating property, wherein the organic resin is formed of acryl base or epoxy base hardened by UV rays.

* * * * *